United States Patent [19]

Deacutis

[11] 4,374,314
[45] Feb. 15, 1983

[54] LASER TEMPLATE TRIMMING OF CIRCUIT ELEMENTS

[75] Inventor: James J. Deacutis, Somerville, Mass.

[73] Assignee: Analog Devices, Inc., Norwood, Mass.

[21] Appl. No.: 293,678

[22] Filed: Aug. 17, 1981

[51] Int. Cl.³ .............................................. B23K 27/00
[52] U.S. Cl. ........................ 219/121 LJ; 219/121 LH; 338/195
[58] Field of Search ................... 219/121 LH, 121 LJ, 219/121 L, 121 LP, 121 LM, 121 LW; 338/195; 29/620

[56] References Cited

U.S. PATENT DOCUMENTS 3,699,649 10/1972 McWilliams ............. 219/121 LP X
4,179,310 12/1979 Compton et al. ................. 357/91 X Primary Examiner—C. L. Albritton
Attorney, Agent, or Firm—Parmelee, Bollinger & Bramblett

[57] ABSTRACT

This invention relates to a method of trimming an element of an integrated circuit with a laser beam. A reflective, or otherwise optically opaque, template-like layer is placed over a portion of the circuit element to control the trimming operation. The laser beam is directed along the sharp edge of this layer in such a way that the maximum energy portion of the beam strikes a part of the circuit element, while low energy portions of the beam are prevented from reaching other parts of the element where they might adversely affect its characteristics.

5 Claims, 3 Drawing Figures

LASER TEMPLATE TRIMMING OF CIRCUIT ELEMENTS

BACKGROUND OF THE INVENTION

This invention pertains to the manufacture of integrated circuits and, more particularly, to the use of a laser for trimming elements of the circuit.

During the manufacture of integrated circuits, it is a common practice to deposit circuit elements, such as resistors, in the form of thin films slightly larger in area than ultimately required. Thereafter, the element is carefully trimmed by removing portions thereof in response to the results of electrical measurements. In this way the element may be trimmed to a desired value within the tolerances established by the designer. In the case of a resistive element, for example, trimming is continued until the resistance is raised to the desired value.

One commonly employed technique for such trimming is by use of a laser. The laser beam is carefully focused onto the circuit element, which usually lies below an oxide, or other transparent dielectric, layer. The laser wavelength selected is such as to be absorbed by the circuit element, which is thereby heated and vaporized.

This technique, while successful and widely used, has certain limitations. For example, laser-trimmed elements frequently exhibit slight but undesirable instability effects which limit the trim tolerance, and thus also the performance level, of the device. It has been found that such instability may be caused by a characteristic of the laser beam in that the energy of the beam is not constant across its diameter. As might be expected, the energy varies in the form of the well-known bell, or Gaussian, curve. The greatest energy is typically concentrated at the optical axis of the laser beam. The beam impinging upon the circuit element volatilizes the material of the element from the optical axis outwardly radially to some dimension corresponding to the "volatilization threshold" of the material. Beyond this threshold radius, outward, to the beam edge, volatilization does not occur. However, that material, so exposed to this low power periphery of laser energy, has changed electrical properties (e.g., resistivity), which are thermally unstable. For each circuit element, this instability is variably dependent on the extent of laser trim of such element. Subsequent manufacturing (i.e., packaging of the device) or other adverse environmental conditions (i.e., long term stability burn-in) will induce a small but unique change in electrical resistance of such circuit element.

The accuracy of performance of a device with a plurality of resistive elements may depend upon the resistive circuit elements remaining fixed in resistive values relative to one another. The designed performance of the device is limited by the above-mentioned induced change in resistive value of each element, as determined by the extent of laser trimming performed on each such element.

For the foregoing reasons, it would be desirable to provide a method for laser trimming a circuit element whereby instability effects are eliminated or substantially minimized. To that end, in accordance with the invention a procedure is provided wherein a clean kerf is formed and the edge of the remaining circuit element is protected from those portions of the laser beam which are below the vaporizing threshold level. The manner in which this and other objects are achieved will be apparent from the following description and appended claims.

SUMMARY OF THE INVENTION

The method of this invention involves the laser trimming of a thin film circuit element which is supported on a substrate and coated with a generally non-conductive optically transparent overlayer. An optically opaque coating is deposited on the overlayer and has an edge which is aligned with a desired trim boundary of the circuit element. A laser is utilized which has an output beam with a non-uniform cross-sectional energy distribution wherein the maximum energy is concentrated near the center of the beam. The laser wavelength is selected to be substantially absorbed by the circuit element and blocked by the opaque coating. The laser beam is directed at the edge of the non-transmissive coating with its peak energy region approximately adjacent the edge, to penetrate and volatilize a portion of the circuit element with its maximum energy region. The beam is relatively moved along the edge to thereby trim the selected region from the circuit element while avoiding contact of low energy portions of the beam with the remaining portion of the circuit element.

DESCRIPTION OF THE PREFERRED EMBODIMENT

Figure 1:
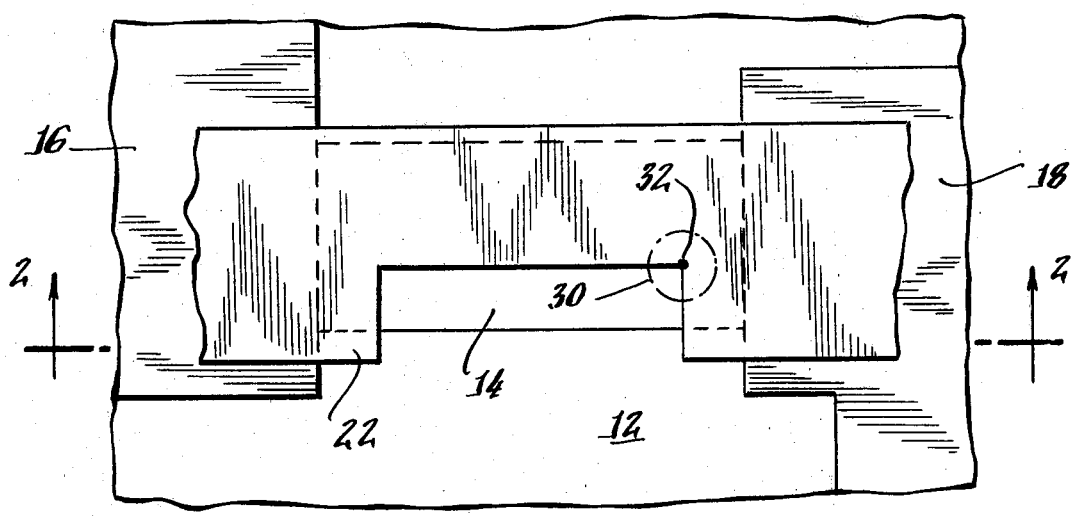
FIG. 1 is a plan view, on a greatly enlarged scale, of a portion of an integrated circuit illustrating the method of this invention.
Figure 2:
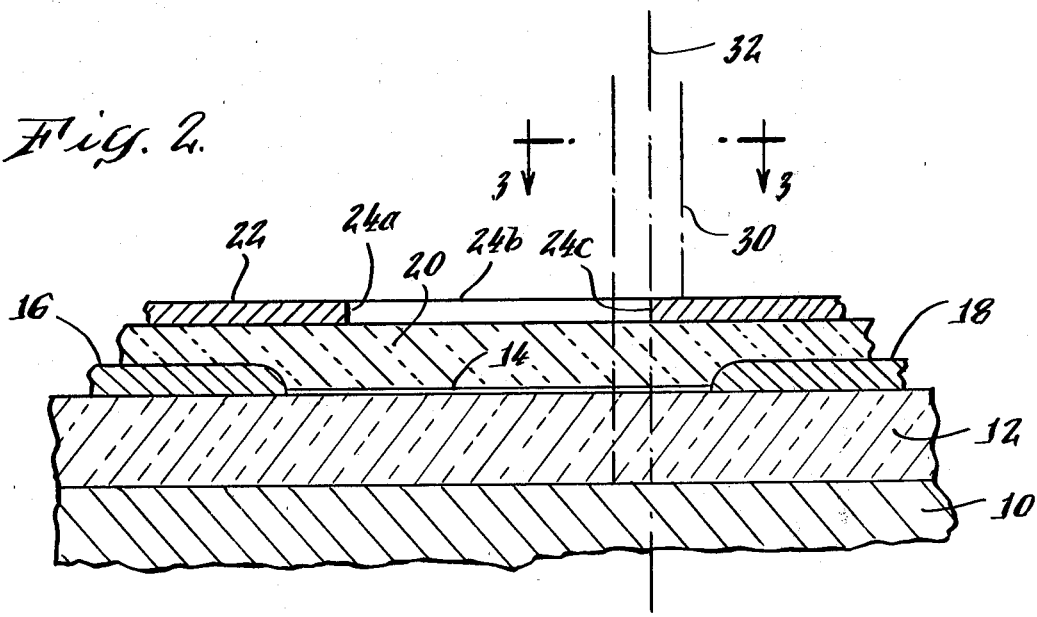
FIG. 2 is a cross-section taken substantially along the line 2—2 of FIG. 1.

With particular reference to FIGS. 1 and 2, there is illustrated a portion of an integrated circuit structure. It comprises a silicon substrate 10 on which is deposited an insulating layer 12 of silicon oxide. Deposited upon the surface of the insulating layer 12 is a circuit element in the form of a thin film resistor 14 which is electrically connected to aluminum contact regions 16, 18. Overlying the thin film resistor 14 and the aluminum contact regions 16, 18 is a layer 20 of silicon oxide or other transparent dielectric passivation. Deposited on top of the layer 20, as by a photolithographic process, is a thin layer of aluminum 22 forming a template-like pattern, and which will hereafter be referred to, for brevity, as a template. The template 22 is positioned directly over portions of the thin film resistor 14 which are not to be volatilized. However, it is positioned in such a fashion as to leave exposed portions of the resistors 14 that may be trimmed. Thus, for example, in the illustrated embodiment the template 22 incorporates a notched region defined by edges 24a, b, c.

Figure 3:
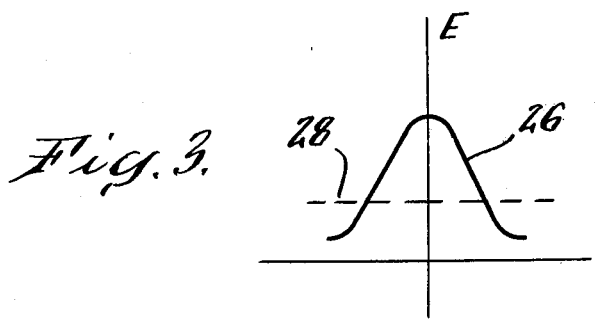
FIG. 3 is a graph of the energy distribution of the laser beam employed in the invention, taken along the line 3—3 of FIG. 2.

The method of this invention employs a conventional laser beam to vaporize, and thereby trim, excess portions from the thin film resistor. Although the laser beam itself is conventional, the manner in which it is employed is not. The laser beams normally employed for applications of this type have diameters of approximately 10–12.5 microns. The energy distribution across such a beam is not uniform; rather, it varies in the form of a bell-shaped, or Gaussian, curve as illustrated in FIG. 3. In FIG. 3 the curve 26 is a plot of the energy level along a diameter of the beam relative to an energy axis E, which also corresponds to the optical axis of the beam. Thus, it will be noted that the energy is greatest at the optical axis of the beam and decreases, more or less asymptotically, with radius. A material which is to be trimmed has a threshold energy level above which it will vaporize in a satisfactory manner to achieve trimming. This threshold level will, of course, vary with the material and its thickness. It is illustrated in FIG. 3 by the dashed line 28.

When a laser beam is used conventionally for trimming, typically the entire diameter of the beam is focused on the circuit element. Those portions of the beam which contain energy above the threshold level 28 cause the circuit element to vaporize, thereby trimming it. However, the effects of the laser beam do not stop with the trimming; that is, those energy levels which are below the threshold level appear also to affect the remaining portions of the circuit element, and in a negative fashion. Although the remaining film is not obliterated and appears generally normal to visual inspection, it has a partially annealed region along the edge which creates instability and adversely affects reproducibility. This makes it extremely difficult to produce a plurality of elements, such as resistors, which exhibit similar electrical characteristics.

FIGS. 1 and 2 illustrate the manner in which these problems are overcome by this invention. As will be seen therein, a laser beam 30 is focused on the resistor 14 in such a fashion that its optical axis 32 is positioned on or close to one of the sharp edges 24a, 24b, 24c, of the template 22. It is then moved along one of these edges to effect trimming. The template 22 is of aluminum, or other energy-absorbing or reflecting material, such as copper. The template thereby prevents energy from those portions of the laser beam 30 which impinge upon it from reaching the resistor 14. This means that the edge of the resistor is trimmed by the highest energy region of the laser beam, while those portions of the resistor immediately adjacent the trimmed edge are fully protected from impingement by low energy regions of the beam. In this manner, a trimmed resistor results which lacks the disadvantages of conventional laser-trimmed circuit elements.

It will be apparent that a number of variations and modifications may be made in this invention without departing from its spirit and scope. For example, the template described above is aluminum and the described structure also has aluminum contacts. If the template is removed by etching, this may create problems by also removing the contacts. If that is the case, another metal may be used, such as copper. Alternatively, a photolithographic step for covering up the contacts may be added before etching the template.

The embodiment of the invention described above utilizes a template having only a single working edge. The template may also define a slot within which the laser beam would be centered. The underlying circuit element would then be protected from low-energy effects of diametrically opposite portions of the laser beam.

Other variations and modifications will suggest themselves to those skilled in the art. Accordingly, this invention is not limited to the specific processes or embodiments described above, but is limited only by the scope of the following claims.

What is claimed is:

1. The method of laser trimming a thin film circuit element supported on a substrate and coated with a generally non-conductive, optically transparent overlayer comprising:
    depositing on said overlayer an optically opaque coating having an edge aligned with a desired trim boundary of said circuit element;
    providing a laser having an output beam with a non-uniform cross-sectional energy distribution wherein the maximum energy is concentrated near the center, and a wavelength substantially absorbed by said circuit element and blocked by said opaque coating;
    directing said laser beam at the edge of said opaque coating with its peak energy approximately adjacent said edge, to penetrate and volatilize a portion of said circuit element with the maximum energy region of said beam; and
    relatively moving said beam along said edge to thereby trim a selected region from said circuit element while substantially avoiding contact of low energy portions of said beam with the remaining portion of said circuit element.

2. The method of claim 1 wherein said opaque coating is reflective of said laser beam.

3. The method of claim 2 wherein said opaque coating is aluminum.

4. The method of claim 2 wherein said opaque coating is copper.

5. The method of claim 1 wherein said opaque coating absorbs the energy of said laser beam.

* * * * *